(12) United States Patent
Kim

(10) Patent No.: US 10,725,695 B2
(45) Date of Patent: Jul. 28, 2020

(54) MEMORY SYSTEM AND OPERATING METHOD THEREOF

(71) Applicant: SK hynix Inc., Gyeonggi-do (KR)

(72) Inventor: Woong-Rae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 195 days.

(21) Appl. No.: 15/940,062

(22) Filed: Mar. 29, 2018

(65) Prior Publication Data

US 2019/0087127 A1 Mar. 21, 2019

(30) Foreign Application Priority Data

Sep. 21, 2017 (KR) .................. 10-2017-0122105

(51) Int. Cl.
| | | |
|---|---|---|
| *G06F 11/00* | (2006.01) | |
| *G06F 3/06* | (2006.01) | |
| *G11C 11/406* | (2006.01) | |
| *G11C 11/409* | (2006.01) | |
| *G11C 11/408* | (2006.01) | |
| *G06F 11/07* | (2006.01) | |
| *G11C 29/52* | (2006.01) | |
| *G06F 11/10* | (2006.01) | |
| *G11C 7/02* | (2006.01) | |
| *G11C 29/04* | (2006.01) | |
| *G11C 7/10* | (2006.01) | |
| *G11C 11/4076* | (2006.01) | |

(52) U.S. Cl.
CPC ............ *G06F 3/0659* (2013.01); *G06F 3/064* (2013.01); *G06F 3/0619* (2013.01); *G06F 3/0673* (2013.01); *G06F 11/0727* (2013.01); *G06F 11/0751* (2013.01); *G06F 11/1048* (2013.01); *G06F 11/1068* (2013.01); *G11C 7/02* (2013.01); *G11C 11/408* (2013.01); *G11C 11/409* (2013.01); *G11C 11/40618* (2013.01); *G11C 29/52* (2013.01); *G11C 7/1006* (2013.01); *G11C 11/4076* (2013.01); *G11C 2029/0411* (2013.01); *G11C 2211/4062* (2013.01)

(58) Field of Classification Search
CPC ...... G06F 3/0659; G06F 3/0619; G06F 3/064; G06F 3/0673
See application file for complete search history.

(56) References Cited

U.S. PATENT DOCUMENTS

| | | | |
|---|---|---|---|
| 2014/0281206 A1* | 9/2014 | Crawford ............. | G11C 11/406 711/106 |
| 2016/0086649 A1* | 3/2016 | Hong .................... | G11C 11/406 365/96 |
| 2016/0180899 A1 | 6/2016 | Kilmer et al. | |

(Continued)

FOREIGN PATENT DOCUMENTS

KR 1020140125986 10/2014

*Primary Examiner* — Katherine Lin
(74) *Attorney, Agent, or Firm* — IP & T Group LLP

(57) ABSTRACT

A memory system includes: a memory device including a plurality of banks; and a memory controller suitable for: controlling an operation of the memory device, calculating row hammer information for each of the banks for each program having a command set requested from a host, and scheduling the banks based on the row hammer information for each of the banks corresponding to a specific program when the specific program is requested from the host.

19 Claims, 11 Drawing Sheets

(56) References Cited

U.S. PATENT DOCUMENTS

2016/0202926 A1* 7/2016 Benedict ............... G11C 11/408
                                                    711/106
2016/0224262 A1* 8/2016 Mandava ........... G11C 14/0009
2017/0011792 A1* 1/2017 Oh .................... G11C 11/40622
2017/0192845 A1* 7/2017 Kim .................... G06F 11/1048
2018/0218767 A1* 8/2018 Wolff ................ G11C 11/40615

* cited by examiner

MEMORY SYSTEM AND OPERATING METHOD THEREOF

CROSS-REFERENCE TO RELATED APPLICATIONS

The present application claims priority to Korean Patent Application No. 10-2017-0122105, filed on Sep. 21, 2017, which is incorporated herein by reference in its entirety.

BACKGROUND

1. Field

Various exemplary embodiments of the present invention relate to a semiconductor design technology, and more particularly, to a memory system capable of preventing a row hammer phenomenon.

2. Description of the Related Art

A memory cell of a memory device is constructed by a transistor serving as a switch and a capacitor for storing charges. Data is divided into 'high' (logic 1) or 'low' (logic 0) depending on whether charges are present in the capacitor of the memory cell, that is, whether a voltage at the terminal of the capacitor is high or low.

In principle, retention of data does not consume power because retention of data is implemented in such a manner that accumulated charges in a capacitor are simply kept there. However, data may be lost because an initial charge stored in a capacitor eventually vanishes due to a leakage current attributable to the PN junction of a transistor. To prevent data loss, data in a memory cell should be read before the data is lost, and a normal amount of charges should be recharged based on read information. Hence, data may be retained only when such an operation is periodically repeated. Such an operation for reading and recharging cell charges is a refresh operation.

The refresh operation is performed whenever a refresh command is inputted from a memory controller to a memory device. The memory controller inputs the refresh command to the memory device with a predetermined time interval by considering the data retention time of the memory device. The data retention time may indicate the time for retaining data of a memory cell without the refresh operation. Since memory cells included in a memory device are designed to have the data retention time above a specific criterion, an interval of the refresh operation may be determined by considering such a criterion.

Moreover, when an amount of charges stored in a memory cell is affected by an active-precharge operation on a word line adjacent to a word line coupled to the memory cell, data of the memory cell may deteriorate in a shorter time than the interval of the refresh operation. This phenomenon is referred to as a row hammer phenomenon.

FIG. 1 is a diagram showing a part of a cell array included in a memory device to assist in the description of a row hammer phenomenon. The reference symbol BL designates bit lines.

Referring to FIG. 1, the reference symbols WLK−1, WLK and WLK+1 designate three word lines which are arranged in a row in a cell array. The word line WLK indicated by the reference symbol HIGH_ACT is a word line of which activation count is large, activation frequency is high or activation time is long. The word lines WLK−1 and WLK+1 are word lines which are disposed adjacent on either side of the word line WLK. The reference symbols CELL_K−1, CELL_K and CELL_K+1 designate memory cells coupled to the word lines WLK−1, WLK and WLK+1, respectively. The memory cells CELL_K−1, CELL_K and CELL_K+1 include respective cell transistors TR_K−1, TR_K and TR_K+1 and respective cell capacitors CAP_K−1, CAP_K and CAP_K+1.

In FIG. 1, when the word line WLK is activated many times, activated frequently or activated for a long time, a voltage of the word line WLK toggles frequently or is retained as a high voltage for a long time. As a result, due to a coupling phenomenon occurring between the word line WLK and each of the word lines WLK−1 and WLK+1, influences may be exerted on data stored in the memory cells CELL_K−1 and CELL_K+1 coupled to the word lines WLK−1 and WLK+1. Such influences may reduce a time for which data stored in memory cells may be retained.

Various research has been developed to improve the performance of a memory system by preventing the row hammer phenomenon.

SUMMARY

Various embodiments are directed to a memory system capable of minimizing the use of banks that are vulnerable to a row hammer phenomenon, and an operation method of the memory system.

In accordance with an embodiment of the present invention, a memory system includes: a memory device including a plurality of banks; and a memory controller suitable for: controlling an operation of the memory device, calculating row hammer information for each of the banks for each program having a command set requested from a host, and scheduling the banks based on the row hammer information for each of the banks corresponding to a specific program when the specific program is requested from the host.

In accordance with an embodiment of the present invention, an operation method of a memory system having a memory device including a plurality of banks and a controller includes: calculating, by the controller, row hammer information for each of a plurality of banks included in a memory device for each program composed of a command set requested from a host; storing, by the controller, the row hammer information in information storage blocks of the controller; and scheduling, by the controller, the banks based on the row hammer information for each bank corresponding to a specific program among the row hammer information stored in the information storage blocks when the specific program is requested from the host.

In accordance with an embodiment of the present invention, a memory system includes: a memory device including a plurality of banks; and a controller suitable for: controlling the memory device to perform a program; detecting a critical address of each bank while performing the program; adjusting a refresh period of each bank, and determining a row hammer occurrence ranking of each bank based on an accumulative number of error corrections corresponding to the critical address while subsequently performing the program; scheduling each bank based on the adjusted refresh period and the row hammer occurrence ranking while further subsequently performing the program.

DETAILED DESCRIPTION

Figure 1:
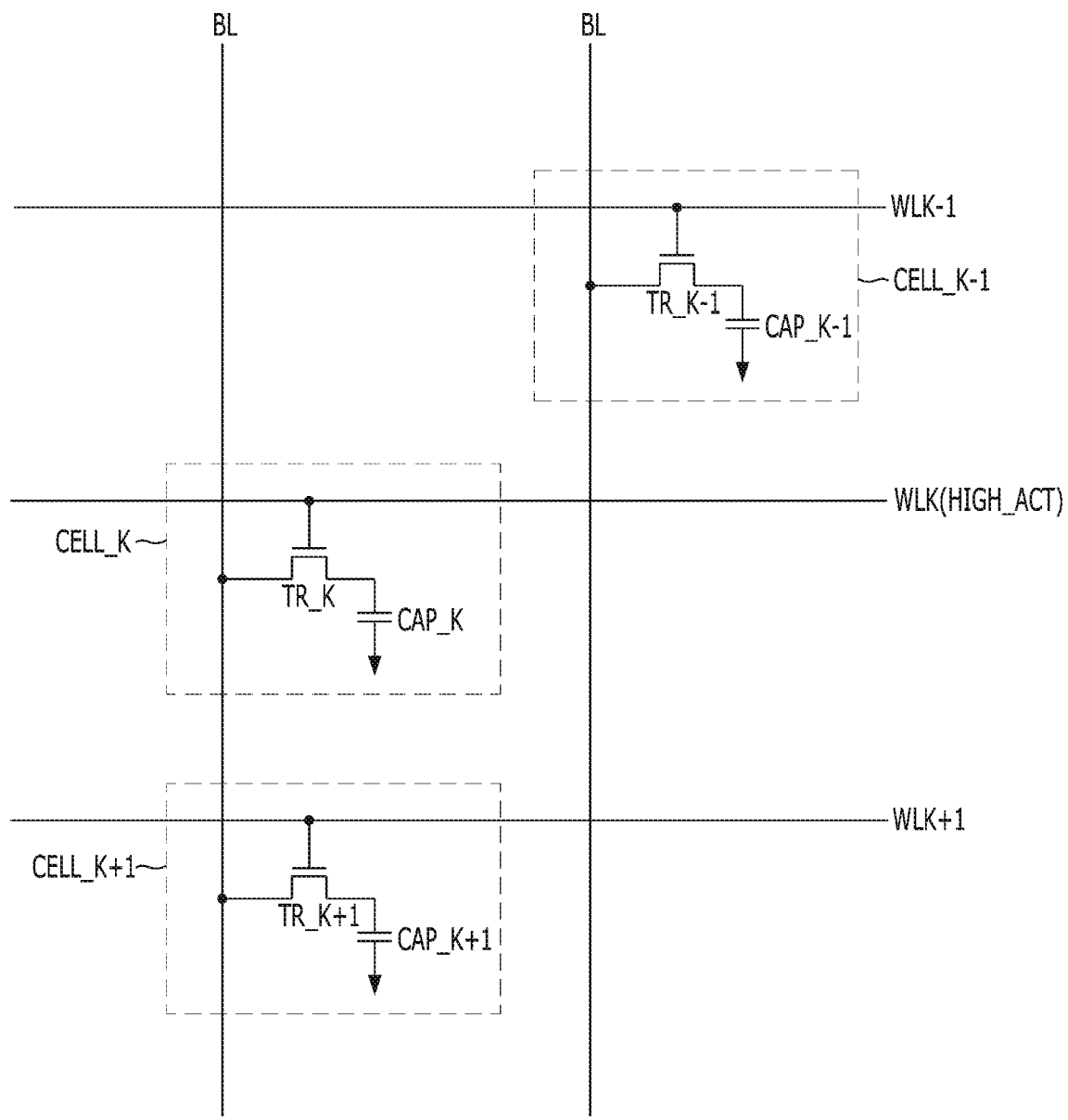
FIG. 1 is a diagram illustrating a part of a cell array included in a memory device which is used to describe a row hammer phenomenon.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In conventional art, it has been suggested to shorten a refresh period as a method to prevent a row hammer phenomenon. However, shortening the refresh period may cause power consumption and performance degradation due to an unnecessary refresh operation. Particularly, even though a memory device is fully tested and shipped, the row hammer phenomenon may further occur due to a system environment in which the memory device is mounted and used in actuality, a combination of commands requested by a CPU (host) in the system environment (hereinafter referred to as a "command set"), and process variables such as a memory cell. In order to prevent the row hammer phenomenon, it is necessary to take measures directly in the field in which a memory system is actually used in consideration of all of the said factors.

Hereinafter, a method to optimize the performance of a memory system in the field in which the memory system is actually used will be proposed.

Figure 2:
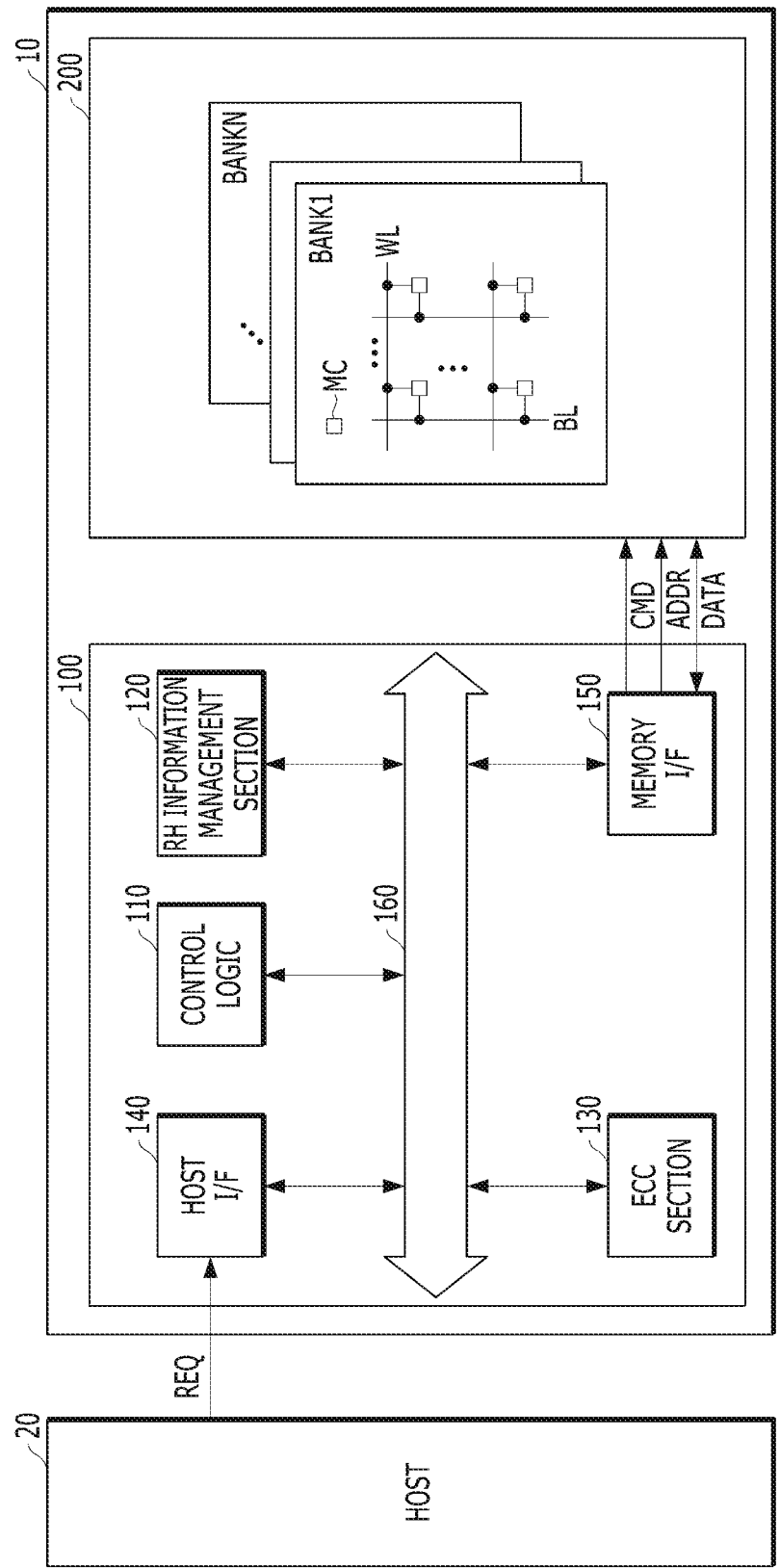
FIG. 2 is a block diagram illustrating a data processing system including a memory system in accordance with an embodiment of the present invention.

FIG. 2 is a block diagram illustrating a data processing system including a memory system in accordance with an embodiment of the present invention.

Referring to FIG. 2, a data processing system may include a memory system 10 and a host 20. The host 20 may represent an independent and substantive processor that may be referred to as a core and may be implemented as a single processor or a multi-core processor including two or more processors. The memory system 10 may include a memory controller 100 and a memory device 200.

The memory device 200 may include a plurality of banks BANK1 to BANKN. Each of the banks BANK1 to BANKN may be comprised of a memory cell array including a plurality of memory cells MC that are coupled between word lines WL and bit lines BL. The memory device 200 in accordance with an embodiment of the present invention, is a memory device including a memory cell array including word lines, and is sufficient as long as a row hammer phenomenon may occur, and is not limited to a specific type of memory device.

The memory controller 100 may transmit a command CMD, data DATA and an address ADDR to the memory device 200 in response to requests REQ inputted from the host 20 to control an operation of the memory device 200. The requests REQ inputted from the host 20 may include only a read command or a write command, whereas it may include a combination (i.e., a command set) of a plurality of commands for executing different applications. Hereinafter, an operation for executing an application in response to the command set inputted from the host 20 is referred to as a "program".

The memory controller 100 in accordance with an embodiment of the present invention may calculate row hammer information on each of the banks BANK1 to BANKN for each program requested from the host 20 and when a specific program is requested from the host 20, the banks BANK1 to BANKN may be scheduled based on the row hammer information on each of the banks BANK1 to BANKN corresponding to the specific program from the calculated row hammer information.

More specifically, the memory controller 100 may include a control logic 110, a row hammer (RH) information management section 120, an error correction code (ECC) section 130, a host interface (I/F) 140, a memory interface (I/F) 150, and a bus 160 coupling them.

The host interface 140 may be disposed between the host 20 and the memory controller 100. The host interface 140 may buffer the requests REQ inputted from the host 20 to transmit to internal components and may transmit processing results of the requests REQ to the host 20.

The memory interface 150 may be disposed between the memory controller 100 and the memory device 200. The memory interface 150 may transmit the command CMD and the address ADDR from the memory controller 100 to the memory device 200 and may transmit/receive the data DATA between the memory device 200 and the memory controller 100.

The ECC section 130 may generate parity bits by using write data during a write operation, and may detect and correct errors included in read data read from the memory device 200 during a read operation. In other words, the ECC section 130 may correct error bits of the read data by using the parity bits but when the number of the error bits exceeds a correctable error bit threshold value, the ECC section 130 may output an error correction failure signal indicating a failure in correcting the error bits. The ECC section 130 may provide the read data whose errors are corrected and error information of the read data to the control logic 110 and provide the error information of the read data to the RH information management section 120.

The RH information management section 120 may set a critical address of each of the banks BANK1 to BANKN based on the command CMD and the address ADDR inputted to each of the banks BANK1 to BANKN during each refresh period of a single program, hereinafter referred to as a "first program".

During a subsequent program hereinafter referred to as a "second program", performed in response to the same command set as the first program, the RH information management section 120 may calculate the row hammer information by accumulatively counting the number of error corrections corresponding to the critical address of each bank. The row hammer information may include a refresh period for each bank for each program and a row hammer occurrence ranking for each bank for each program.

The control logic 110 may control overall operations of the memory system 10, and may control the write operation or the read operation on the memory device 200 in response to the requests REQ from the host 20. In addition, the control logic 110 may perform an address remap operation through a bank address swap based on repair information of the memory device 200 or the error information of the read data provided from the ECC section 130. Thus, as the control logic 110 schedules a bank in which a repair or an error occurs so as not to be used, the performance of the memory system 10 may be improved.

Particularly, when a specific program is requested from the host 20, the control logic 110 in accordance with an embodiment of the present invention may schedule the banks BANK1 to BANKN by performing the address remap operation based on the row hammer information for each bank corresponding to the specific program, from the row hammer information calculated by the RH information management section 120.

For example, when it is detected based on the row hammer information, particularly, the row hammer occurrence ranking for each bank for each program, that the row hammer phenomenon occurs most in the first bank during the first program, the control logic 110 may schedule the first bank to be selected at a minimum during the first program through the address remap operation. Simultaneously, the control logic 110 may control the refresh period of the first bank to be shorter than the other banks by using the refresh period of each bank for each program of the row hammer information even though the first bank is selected, thereby optimizing the performance of the memory system 10.

When it is detected based on the row hammer information, particularly, the row hammer occurrence ranking for each bank for each program, that the row hammer phenomenon occurs least in the second bank during the second program, the control logic 110 may schedule the second bank to be selected more frequently than the other banks during the second program through the address remap operation. Simultaneously, the control logic 110 may control the refresh period of the second bank to be longer than the other banks by using the refresh period of each bank for each program of the row hammer information.

Accordingly, the memory system in accordance with an embodiment of the present invention may minimize the use of banks vulnerable to the row hammer phenomenon for each program by calculating a ranking of banks representing deterioration degree by the row hammer for each program and scheduling the banks through the address remap operation. Consequently, the performance of the memory system may be optimized.

Moreover, although the memory controller 100 described above has a configuration directly related to this invention, the memory controller 100 may further include other configurations in addition to the aforementioned configuration. For example, as an operation memory of the memory controller 100, a memory (not illustrated) for storing data for driving the memory controller 100 may be further included. The memory may temporarily store data required for the operations of the memory controller 100 and the memory device 200 when the memory controller 100 provides the read data from the memory device 200 to the host 200 and provides the write data from the host 20 to the memory device 200 in response to the requests REQ from the host 20.

Figure 3:
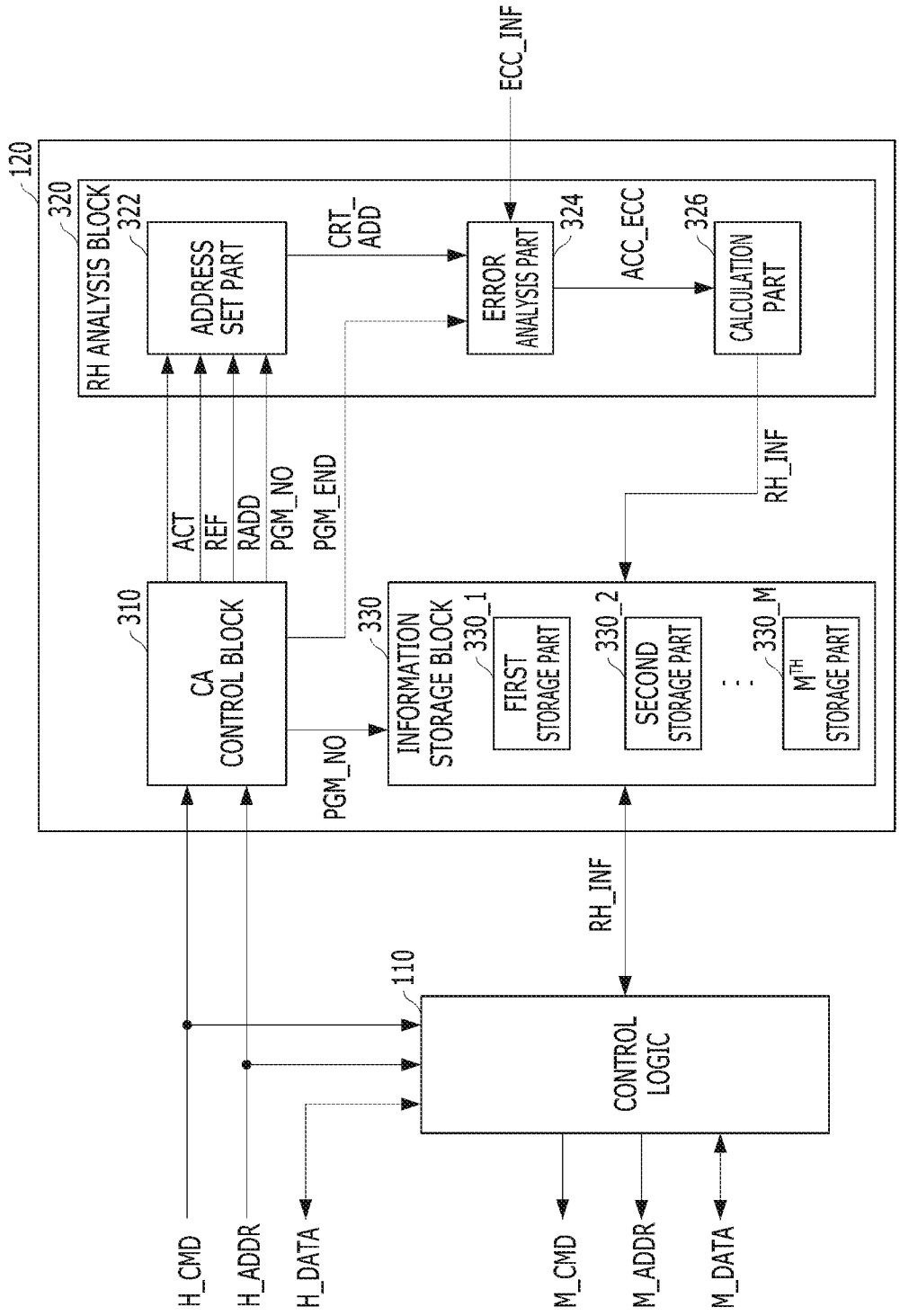
FIG. 3 is a block diagram illustrating a memory system in accordance with an embodiment of the present invention.

FIG. 3 is a block diagram illustrating a memory system in accordance with an embodiment of the present invention.

FIG. 3 is a detailed block diagram illustrating the control logic 110 and the RH information management section 120 of the memory system 10.

For the sake of convenience in description, the configurations of the ECC section 130, the host interface 140 and the memory interface 150 shown in FIG. 2 are omitted in FIG. 3. FIG. 3 illustrates that error information ECC_INF is provided from the ECC section 130 to the RH information management section 120, a host command H_CMD, a host address H_ADDR and host data H_DATA are provided from the host 20 through the host interface 140, and a memory command M_CMD, a memory address M_ADDR and memory data M_DATA are provided to and from the memory device 200 through the memory interface 150.

Referring to FIG. 3, the RH information management section 120 may include a command/address (CA) control block 310, a RH analysis block 320, and an information storage block 330.

The CA control block 310 may output a program type signal PGM_NO, an active command ACT and a target address RADD based on the host command H_CMD and the host address H_ADDR. The CA control block 310 may generate a program termination signal PGM_END and a refresh command REF based on the host command H_CMD and the host address H_ADDR. The program termination signal PGM_END may represent an end of a single program session, and the refresh command REF may define the refresh period.

The program type signal PGM_NO may represent a type of a program depending on command sets. For example, when a first program is to be performed through execution of a first application in response to a command set of a sequence of 'command A—command B—command C—command A', and a second program is to be performed through execution of a second application in response to command set of a sequence of 'command D—command E', the program type signal PGM_NO may have a first bit indicating the first program and a second bit indicating the second program. In another embodiment, the program type signal PGM_NO may have a bit having a logic low level indicating the first program and a logic high level indicating the second program. However, this is merely an example and the type of the programs according to this invention is not limited thereto. For example, when there are M types of programs, the program type signal PGM_NO may include a plurality of bits, for example, bits that are equal to or greater than $\log_2 M$ and equal to or less than M, for indicating the respective M types of the programs. The program termination signal PGM_END may be activated when a corresponding program is completed.

The target address RADD may include information on a bank address of a specific bank and the row address of the bank. The active command ACT may activate word lines of the specific bank corresponding to the target address RADD.

The RH analysis block 320 may set a critical address CRT_ADD of each bank based on the active command ACT and the target address RADD during each refresh period of a first program and may calculate row hammer information RH_INF of each bank by accumulatively counting the number of error corrections corresponding to the critical address CRT_ADD during a second program performed in response to the same command set as the first program. An adjacent address of the target address RADD of a bank may be selected as the critical address CRT_ADD of the bank when a number of the active command ACT input to the bank exceeds a threshold value during a single refresh period, which will be described later with reference to FIG. 4. The RH analysis block 320 may identify a specific program based on the program type signal PGM_NO and the program termination signal PGM_END, and identify a single refresh period based on the refresh command REF.

The row hammer information RH_INF for each bank information may be stored in the information storage block 330 based on the program type signal PGM_NO. The information storage block 330 may include first to $M^{th}$ storage parts 330_1 to 330_M which correspond to the M types of programs, may select a corresponding storage part from the first to $M^{th}$ storage parts 330_1 to 330_M and may store the row hammer information RH_INF of each bank in the selected storage part based on the program type signal PGM_NO.

When a specific program is requested from the host, the control logic 110 may perform the address remap operation by using the row hammer information RH_INF of each bank stored in a storage part corresponding to the specific program among the first to $M^{th}$ storage parts 330_1 to 330_M included in the information storage block 330 to provide the memory command M_CMD, the memory address M_ADDR and the memory data M_DATA to the memory device 200.

The RH analysis block 320 may include an address set part 322, an error analysis part 324, and a calculation part 326.

The address set part 322 may count the number of the active command ACT inputted to each bank during each refresh period of the first program and may set the critical address CRT_ADD of each bank based on the count number of the active command ACT and the target address RADD.

The error analysis part 324 may accumulatively count the number of error corrections corresponding to the critical address CRT_ADD of each bank based on the error information ECC_INF provided from the error correction code (ECC) block 130 during the second program and may output the number of error corrections, which is accumulatively counted, as the accumulative number of error corrections ACC_ECC.

The calculation part 326 may calculate the row hammer information RH_INF of each bank based on the accumulative number of error corrections ACC_ECC.

Figure 4:
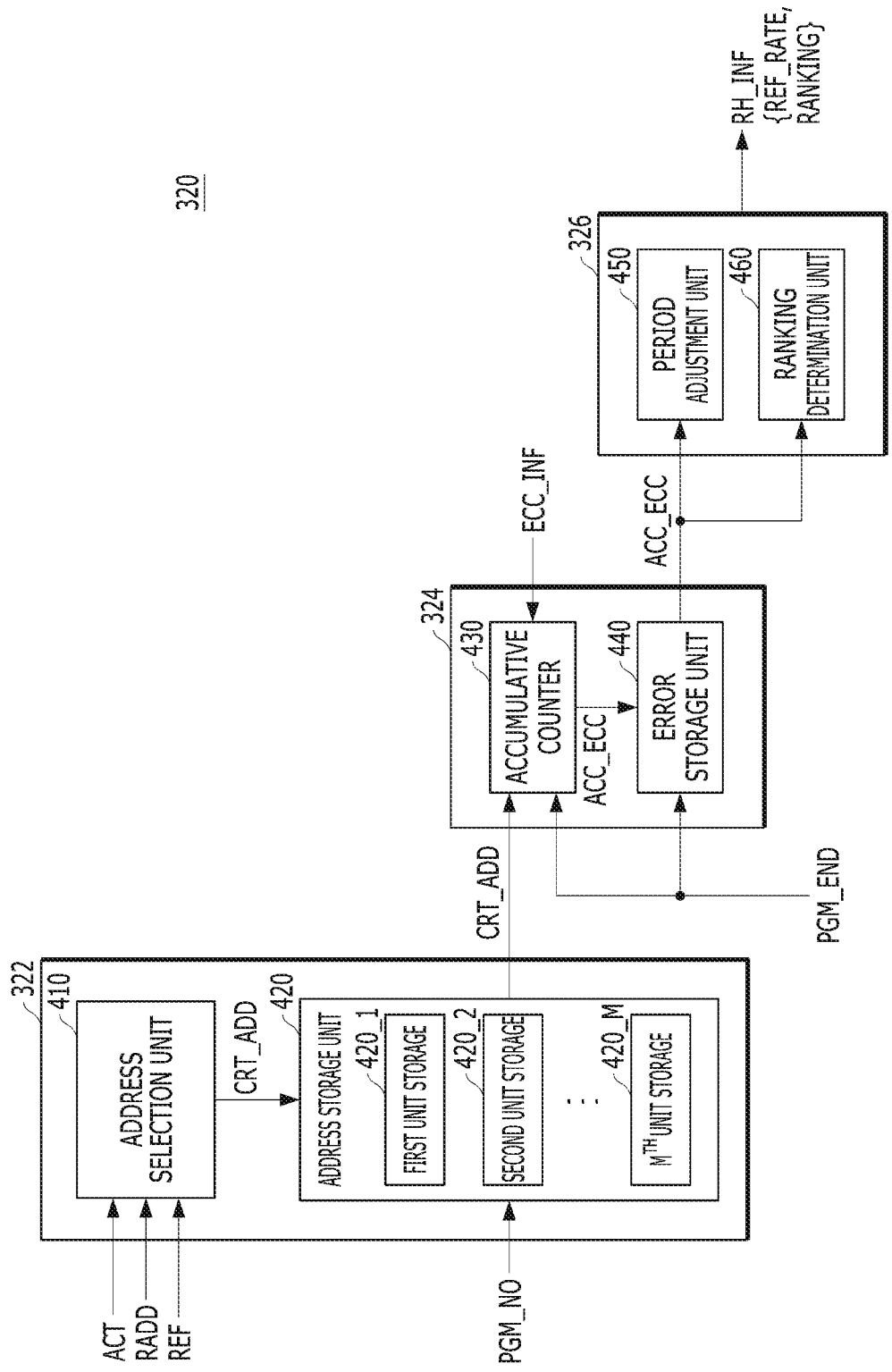
FIG. 4 is a block diagram illustrating a row hammer analysis block shown in FIG. 3.

FIG. 4 is a detailed block diagram illustrating the RH analysis block 320 shown in FIG. 3.

Referring to FIG. 4, the address set part 322 may include an address selection unit 410 and an address storage unit 420.

When the number of the active command ACT inputted to each bank is counted for each the target address RADD according to the refresh command REF and the count number of the active command ACT exceeds a threshold value, the address selection unit 410 may select an adjacent address of the target address RADD as the critical address CRT_ADD of each bank. The address selection unit 410 may count the number of the active command ACT inputted to each bank for each target address RADD and may include a counter that is reset according to the refresh command REF. Thus, the address selection unit 410 may initialize the count number of the active command ACT for each refresh period. The address selection unit 410 may provide the critical address CRT_ADD of each bank to the address storage unit 420.

The adjacent address may be for designating word lines adjacent to a target word line corresponding to the target address RADD to which the active command ACT is executed. The adjacent word lines may represent one or two word lines adjacent to the target word line. In another embodiment, the adjacent word lines may represent eight, sixteenth or any other number of word lines adjacent to the target word line.

In this embodiment, the threshold value serving as a comparison reference may be determined experimentally in advance. If the threshold value is too small, an operation required for activating the adjacent word lines is frequently performed, which may degrade the performance of the system. If the threshold value is too large, corruption of data caused by row hammering may not be prevented. Therefore, the threshold value may be determined in consideration of various factors such as successive accesses to the target word line, the number of activation times of the target word line, the refresh period, word line access distribution in the memory device and so on.

The address storage unit 420 may store or output the critical address CRT_ADD of each bank selected by the address selection unit 410 based on the program type signal PGM_NO. The address storage unit 420 may include first to $M^{th}$ unit storages 420_1 to 420_M which correspond to the M types of programs. The address storage unit 420 may store the critical address CRT_ADD of each bank in a corresponding unit storage among the first to $M^{th}$ unit storages 420_1 to 420_M or may output the stored critical address CRT_ADD, based on the program type signal PGM_NO. For example, when the program type signal PGM_NO indicating a specific program is inputted for a first time or an odd-numbered time, the address storage unit 420 may store the critical address CRT_ADD of each bank, which is provided from the address selection unit 410, in the first unit storage 420_1 corresponding to the specific program. When the program type signal PGM_NO indicating the specific program is inputted for a second time or an even-numbered time, the address storage unit 420 may output to the error analysis part 324 the critical address CRT_ADD of each bank stored in the first unit storage 420_1.

The error analysis part 324 may include an accumulative counter 430 and an error storage unit 440.

The accumulative counter 430 may output to the error storage unit 440 the accumulative number of error corrections ACC_ECC by accumulatively counting the number of error corrections corresponding to the critical address CRT_ADD of each bank based on the error information ECC_INF in response to the program termination signal PGM_END. The accumulative counter 430 may accumulatively count the number of error corrections corresponding to the critical address CRT_ADD of each bank during a single program.

The error storage unit 440 may store the accumulative number of error corrections ACC_ECC of each bank provided from the accumulative counter 430. The accumulative counter 430 and the error storage unit 440 may be reset according to the program termination signal PGM_END, thereby initializing the accumulative number of error corrections ACC_ECC which is accumulatively counted during the single program. The error storage unit 440 may provide the stored accumulative number of error corrections ACC_ECC of each bank to the calculation part 326.

The calculation part 326 may include a period adjustment unit 450 and a ranking determination unit 460.

The period adjustment unit 450 may adjust the refresh period of each bank based on the accumulative number of error corrections ACC_ECC. For example, the period adjustment unit 450 may increase the refresh period of a certain bank when an accumulative number of error corrections ACC_ECC corresponding to the certain bank is greater than a threshold value.

The ranking determination unit 460 may determine a row hammer occurrence ranking for each bank based on the accumulative number of error corrections ACC_ECC.

The refresh period of each bank that is adjusted by the period adjustment unit 450 and the row hammer occurrence ranking of each bank that is determined by the ranking determination unit 460 may be outputted as the row hammer information RH_INF of each bank.

Through the aforementioned process, the RH analysis block 320 may calculate and output the row hammer information RH_INF including the refresh period REF_RATE and the row hammer occurrence ranking RANKING of each bank for each program.

Figure 5:
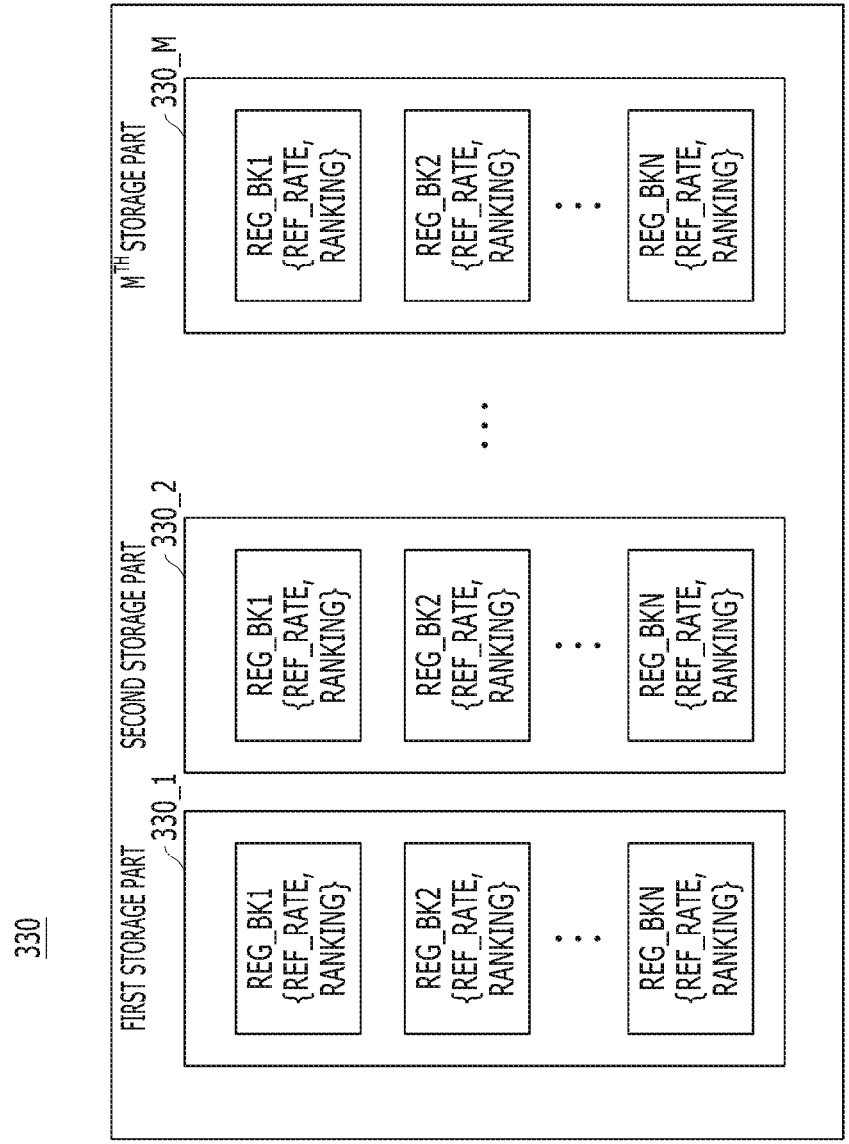
FIG. 5 is a block diagram illustrating an information storage block shown in FIG. 3.

FIG. 5 is a block diagram illustrating the information storage block 330 shown in FIG. 3.

Referring to FIG. 5, the information storage block 330 may include the first to $M^{th}$ storage parts 330_1 to 330_M to be selected according to the program type signal PGM_NO.

Each of the first to $M^{th}$ storage parts 330_1 to 330_M may include N unit storages REG_BK1 to REG_BKN which correspond to the number of the plurality of banks BANK1 to BANKN. In other words, the information storage block 330 in accordance with an embodiment of the present invention may include M*N unit storages which correspond to the M types of programs*the N banks. The row hammer information RH_INF including the refresh period REF_RATE and the row hammer occurrence ranking RANKING of each bank for each program may be stored in each of the M*N unit storages according to the respective M types of programs for the respective N banks.

Hereinafter, descriptions for an operating method of the memory system 10 in accordance with an embodiment of the present invention will be provided with reference to FIGS. 2 to 10.

The operating method for the memory system 10 will be described by dividing it into a first procedure and a second procedure. During the first procedure, the critical address CRT_ADD of each bank may be set, and, during the second procedure, the accumulative number of error corrections ACC_ECC may be generated for the critical address CRT_ADD of each bank to calculate the row hammer information RH_INF of each bank.

After the first procedure is performed during the first program, the second procedure may be performed during the second program and is performed in response to the same command set as the first program. In other words, each of the first and second procedures may be sequentially and independently performed during the same programs and are performed in response to the same command set as each other. Also, the first and second procedures may be performed only once during a power-up operation (i.e., a boot-up operation) or periodically according to a request of the host.

Figure 6:
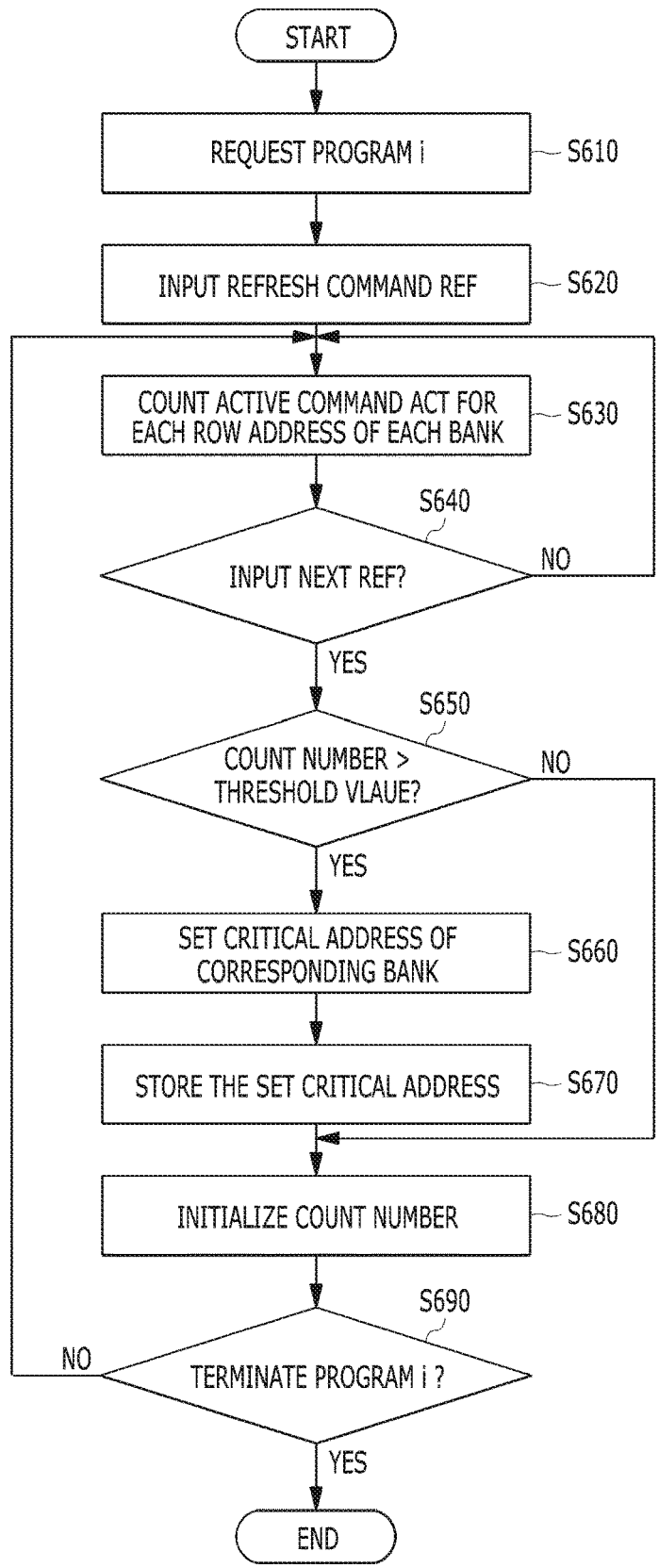
FIG. 6 is a flowchart illustrating a first procedure of a memory system in accordance with an embodiment of the present invention.

FIG. 6 is a flowchart illustrating the first procedure of the memory system 10 in accordance with an embodiment of the present invention.

Figure 7:
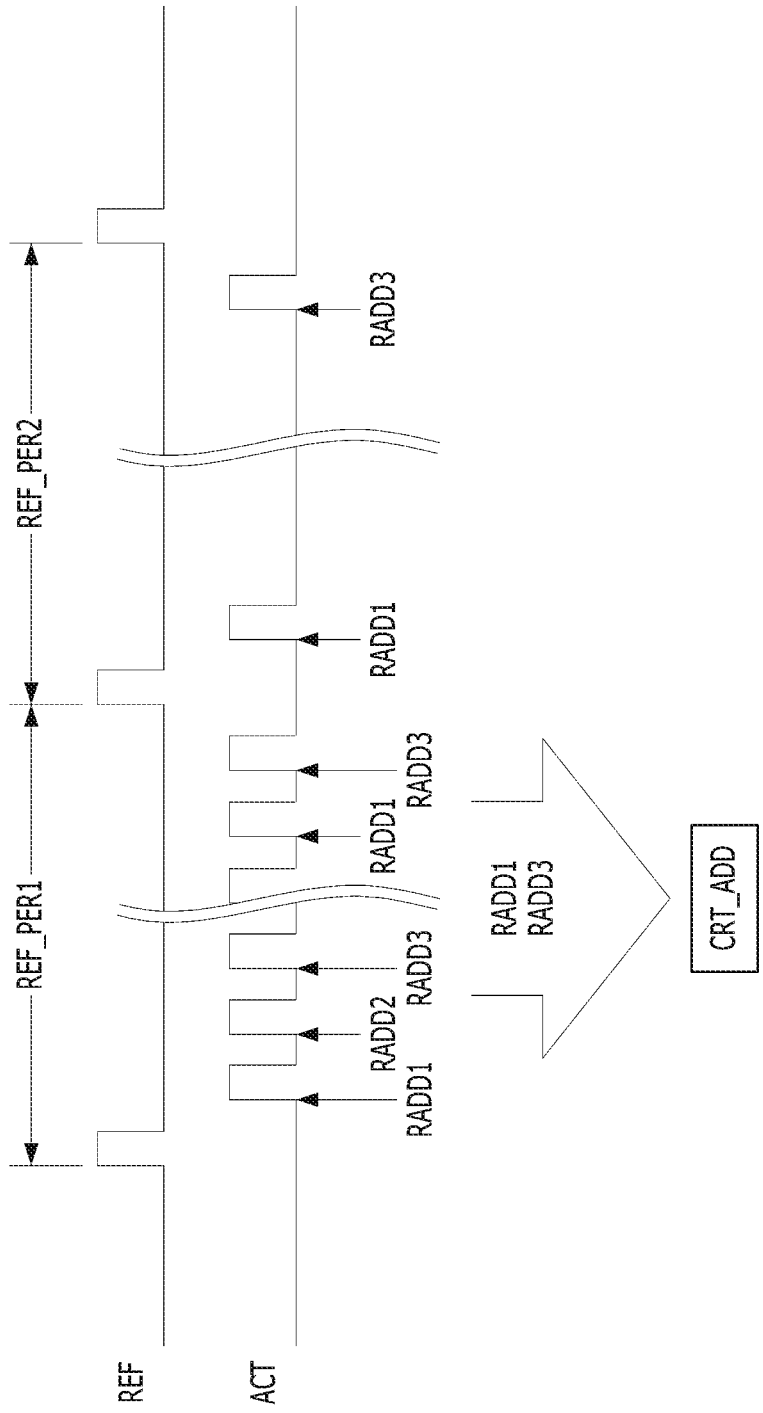
FIG. 7 is a timing diagram illustrating the first procedure of the memory system shown in FIG. 6.

FIG. 7 is a timing diagram illustrating the first procedure shown in FIG. 6.

Figure 8A:
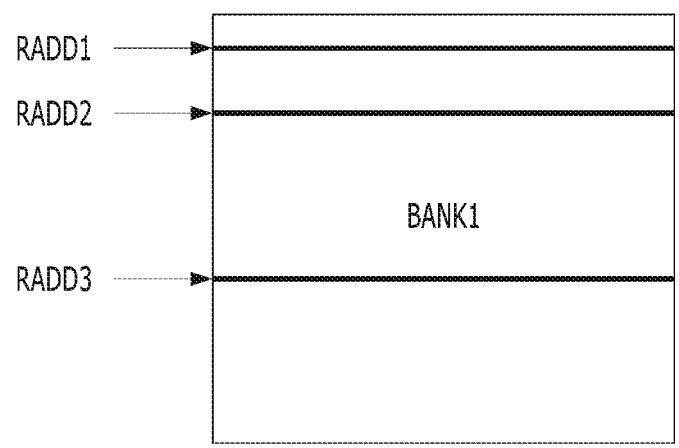
FIGS. 8A and 8B are diagrams used to describe the first procedure of the memory system shown in FIGS. 6 and 7.
Figure 8B:
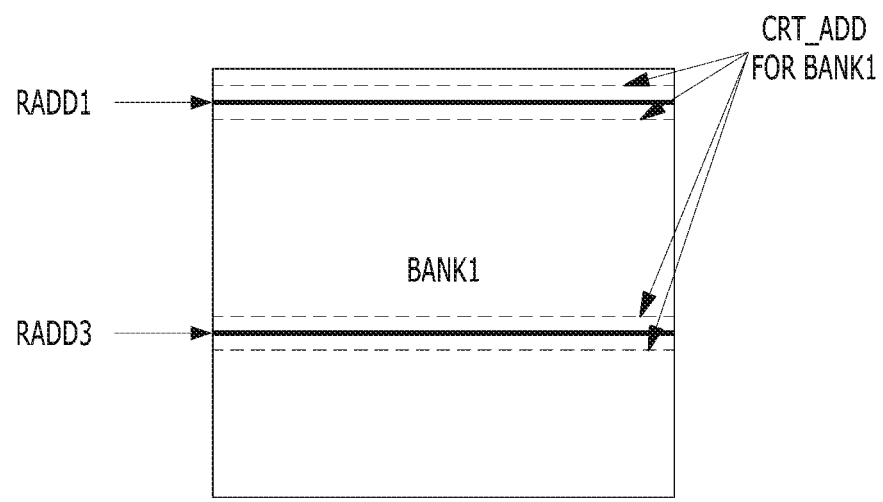

FIGS. 8A and 8B are diagrams used to describe the first procedure shown in FIGS. 6 and 7.

Referring to FIG. 6, when a specific program is requested from the host 20 in step S610, the CA control block 310 may output the program type signal PGM_NO representing the type of the specific program 'i', the refresh command REF, the active command ACT and the target address RADD based on the host command H_CMD and the host address H_ADDR.

When the refresh command REF is inputted in step S620, the address selection unit 410 may count in step S630 the number of the active command ACT inputted to each bank for each target address RADD until a subsequent refresh command REF is inputted.

Until the subsequent refresh command REF is inputted, step S630 may be repeated ("NO" in step S640).

When the subsequent refresh command REF is inputted ("YES" in step S640), the address selection unit 410 may determine whether the count number of the active command ACT exceeds the threshold value in step S650.

When the count number of the active command ACT exceeds the threshold value ("YES" in step S650), the address selection unit 410 may select the adjacent address of the target address RADD as the critical address CRT_ADD for each bank in step S660.

Then, the address storage unit 420 may store the critical address CRT_ADD for each bank based on the program type signal PGM_NO in step S670.

Accordingly, the critical address CRT_ADD for each bank may be stored in the address storage unit 420.

When the count number does not exceed the threshold value ("NO" in step S650), the address set part 322 may not set the critical address CRT_ADD of the corresponding bank.

Then, the address selection unit 410 may initialize the count number of the active command ACT based on the refresh command REF in step S680.

Until the specific program T is completed, steps S630 to S680 may be repeated ("NO" in step S690). When the specific program 'i' is completed ("YES" in step S690), the first procedure may be terminated.

Referring to FIGS. 7 and 8A, the number of the active command ACT inputted to each bank may be counted for each target address RADD during a first refresh period REF_PER1. For example, during the first refresh period REF_PER1, the active command ACT is inputted ten times for a first row address RADD1 of the first bank and the active command ACT is inputted seven times for a third row address RADD3 of the first bank so that the count number of the active command ACT exceeds the threshold value which is set to five, the adjacent address of the first row address RADD1 and the third row address RADD3 may be set as the critical address CRT_ADD of the first bank as shown in FIGS. 7 and 8B. During a second refresh period REF_PER2, if the count number of the active command ACT for the row address of the first bank does not exceed the threshold value, the critical address CRT_ADD of the first bank may not be set.

Figure 9:
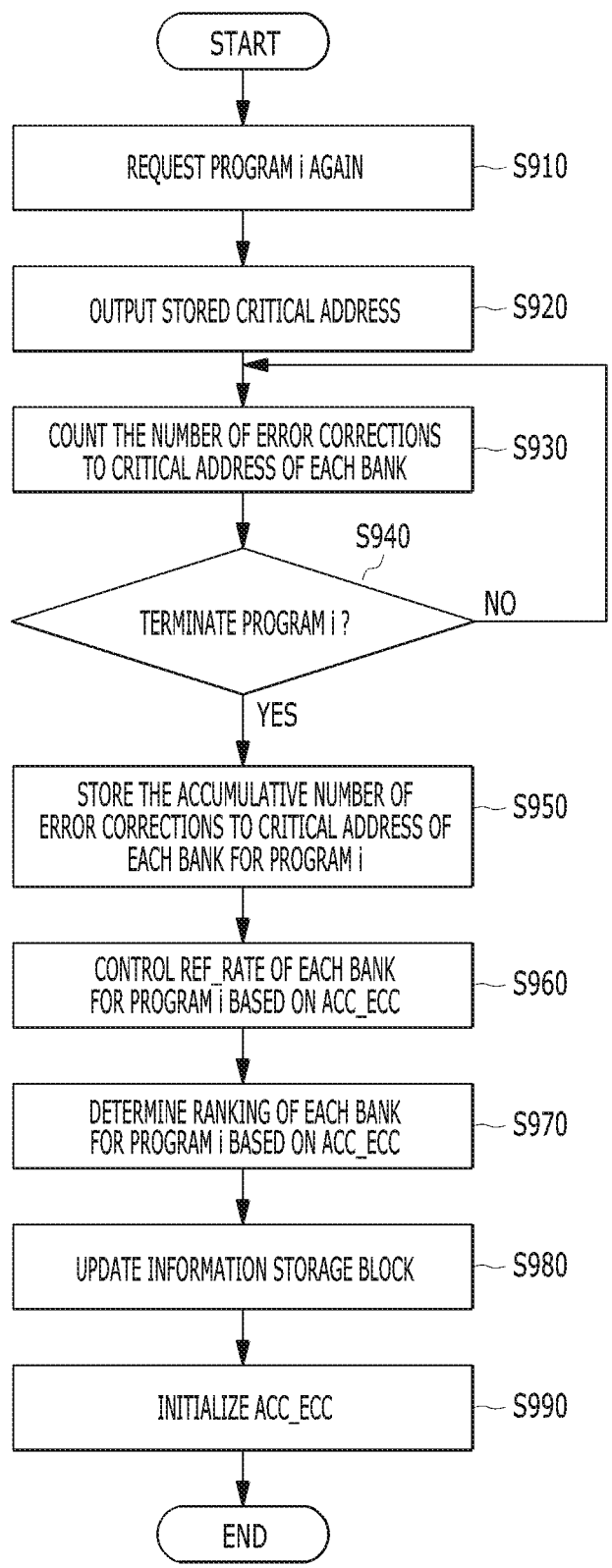
FIG. 9 is a flowchart illustrating a second procedure of a memory system in accordance with an embodiment of the present invention.

FIG. 9 is a flowchart illustrating the second procedure of the memory system 10 in accordance with an embodiment of the present invention.

Figure 10:
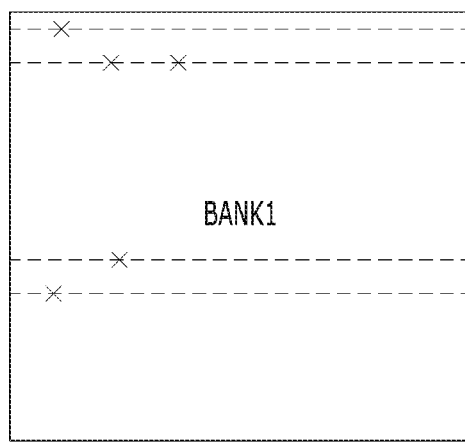
FIG. 10 is a diagram used to describe the second procedure of the memory system shown in FIG. 9.

FIG. 10 is a diagram used to describe the second procedure shown in FIG. 9.

Referring to FIGS. 9 and 10, after the specific program 'i' is executed and the critical address CRT_ADD of each bank is set, the specific program 'i' may be requested again from the host 20 in step S910.

The CA control block 310 may output the program type signal PGM_NO representing the type of the specific program 'i', the program termination signal PGM_END for the specific program 'i', the refresh command REF, the active command ACT and the target address RADD based on the host command H_CMD and the host address H_ADDR.

The address storage unit 420 may output the critical address CRT_ADD of each bank, which is generated for the previously performed program 'i' as described with reference to FIGS. 7 and 8, based on the program type signal PGM_NO in step S920.

The accumulative counter 430 may accumulatively count the number of error corrections corresponding to the critical address CRT_ADD of each bank stored in the address storage unit 420 based on the error information ECC_INF during the current program 'i' to generate the accumulative number of error corrections ACC_ECC in step S930.

Step S930 may be repeated until the current program 'i' is terminated according to the program termination signal PGM_END.

When the specific current program is terminated based on the program termination signal PGM_END ("YES" in step S940), the error storage unit 440 may store the accumulative number of error corrections ACC_ECC of each bank for the current program 'i', which is provided from the accumulative counter 430, in step S950.

The calculation part 326 may calculate the row hammer information RH_INF of each bank based on the accumulative number of error corrections ACC_ECC of each bank for the currently completed program 'i'.

More specifically, the period adjustment unit 450 included in the calculation part 326 may adjust the refresh period of each bank based on the accumulative number of error corrections ACC_ECC in step S960.

The ranking determination unit 460 may determine the row hammer occurrence ranking of each bank based on the accumulative number of error corrections ACC_ECC in step S970. The refresh period of each bank that is adjusted by the period adjustment unit 450 and the row hammer occurrence ranking of each bank that is determined by the ranking determination unit 460 may be outputted as the row hammer information RH_INF of each bank.

The information storage block 330 may select the corresponding storage part from the first to M$^{th}$ storage parts 330_1 to 330_M based on the program type signal PGM_NO representing the type of the specific program 'i' and may store the row hammer information RH_INF of each bank that is transmitted from the calculation part 326 in step S980.

Subsequently, the accumulative counter 430 and the error storage unit 440 may be reset in response to the program termination signal PGM_END, thereby initializing the accumulative number of error corrections ACC_ECC that is accumulatively counted during the currently completed program 'i' in step S990.

Subsequently, when the specific program 'i' is requested from the host 20 three or more times, the control logic 110 may perform the address remap operation by using the row hammer information RH_INF of each bank stored in the storage part corresponding to the specific program 'i', and then may provide the memory command M_CMD, the memory address M_ADDR and the memory data M_DATA to the memory device 200.

As described above, in accordance with an embodiment of the present invention, the memory controller 100 may monitor a row hammer fail tendency of each of the banks of the memory device 200 for each program in response to a command set provided from the host 20, and may manage the row hammer fail tendency as row hammer information RH_INF. Subsequently, when a specific program is requested from the host 20, the banks may be scheduled so that a bank having a low row hammer occurrence ranking is preferentially selected through the address remap operation based on the row hammer information RH_INF on each of the banks corresponding to the specific program. If necessary, the refresh period of the bank having the low row hammer occurrence ranking may be adjusted longer than that of the other banks. Thus, the performance of the memory system in the field may be optimized.

In the field of CPU manufacturing, a processor for deep learning that allows users to freely switch programs through FPGA, etc., is likely to become a major technology trend. When a trend in which the user directly modifies and creates a CPU program for machine learning/artificial intelligence, etc. is set, it is expected that the memory controller monitors the row hammer information on each bank for each program by analyzing various programs written by the user in real time, thereby reflecting the row hammer information directly in CPU scheduling which is important.

It is described as an example that the row hammer information RH_INF is stored for each bank since process variations in one bank are substantially small, that is, process characteristics of cells in one bank are substantially similar to each other. However, the present invention is not limited thereto. In another embodiment of the present invention, in lieu of the row hammer information RH_INF for each bank, the ranking or the row hammer information RH_INF in units of memory blocks may be stored.

Also, it is described as an example that the row hammer information RH_INF is stored for each program since the row hammer phenomenon has a fail tendency to be greatly influenced by the active command ACT and the refresh command REF patterns. However, the present invention is not limited thereto. In another embodiment of the present invention, in lieu of the row hammer information RH_INF for each program, the row hammer information RH_INF may be stored in units that may affect the row hammer phenomenon.

Hereinafter, a memory system executing programs simultaneously will be described with reference to FIG. 11.

Figure 11:
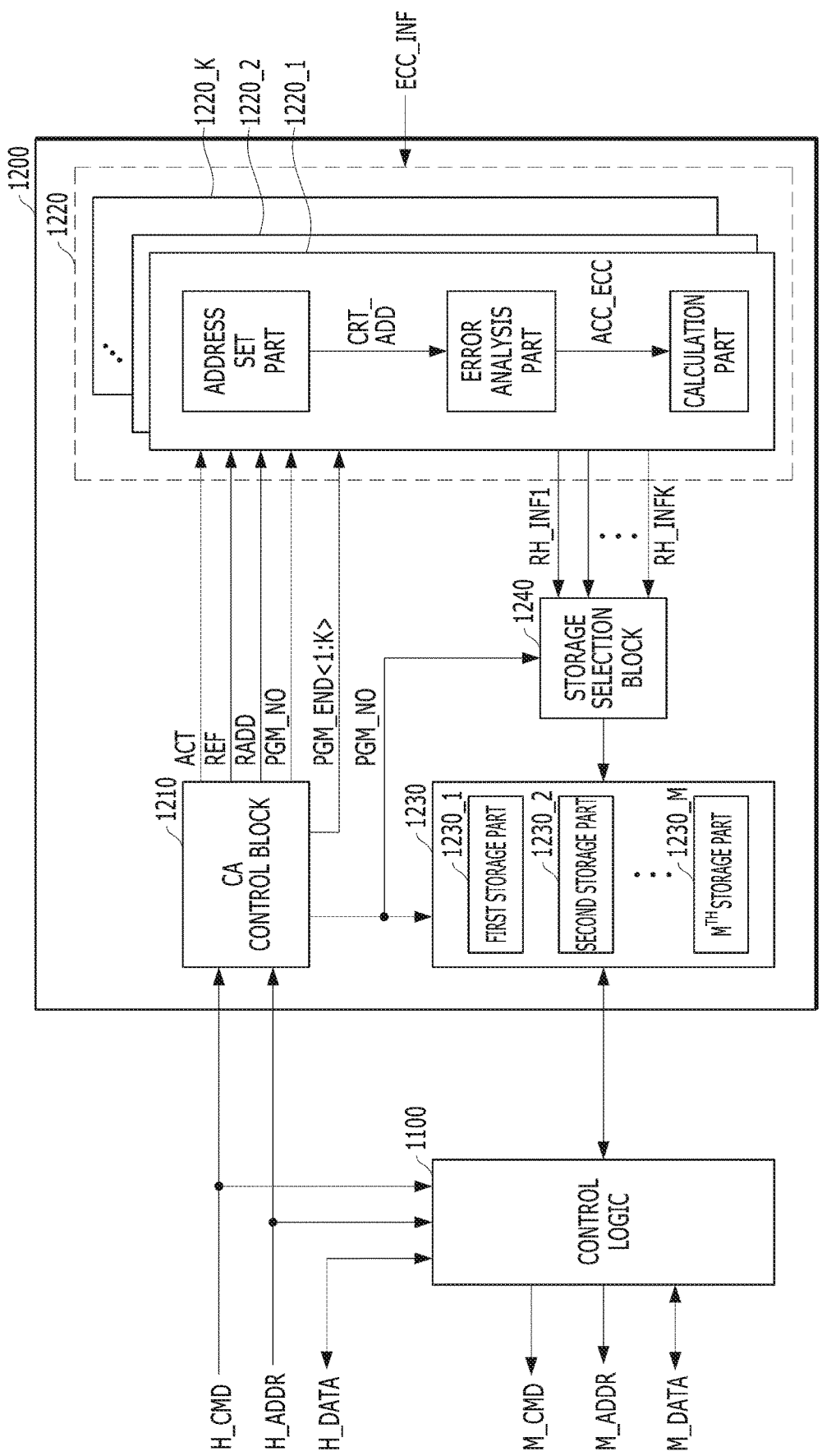
FIG. 11 is a block diagram illustrating a memory system in accordance with an embodiment of the present invention.

FIG. 11 is a detailed block diagram illustrating a row hammer (RH) information management section 1200 in accordance with another embodiment of the present invention. The RH information management section 1200 of FIG. 11 may correspond to the RH information management section 120 of FIG. 2.

Referring to FIG. 11, the RH information management section 1200 may include a command/address (CA) control block 1210, a RH analysis block 1220, an information storage block 1230, and a storage selection block 1240.

The CA control block 1210 may output a program type signal PGM_NO, an active command ACT and a target address RADD based on a host command H_CMD and a host address H_ADDR. The CA control block 1210 may generate a plurality of program termination signals PGM_END<1:K> and a refresh command REF based on the host command H_CMD and the host address H_ADDR. The plurality of program termination signals PGM_END<1:K> may represent ends of K program sessions in which the K programs are simultaneously performed, and the refresh command REF may define a refresh period.

In the embodiment, the program type signal PGM_NO may represent types of programs which are simultaneously performed depending on command sets. For example, when a first program for executing a first application and a second program for executing a second application are simultaneously performed in the memory system capable of simultaneously performing a maximum of four programs, the program type signal PGM_NO may be composed of four bits having a logic value of '0011' representing the first and second programs on operation.

The RH analysis block 1220 may include a plurality of RH analyzers 1220_1 to 1220_K. The plurality of RH analyzers 1220_1 to 1220_K may correspond to the maximum number of the programs which are simultaneously performed, and may be activated depending on each bit of the program type signal PGM_NO. For example, four RH analyzers may be included and the first and second RH analyzers 1220_1 and 1220_2 may be simultaneously activated based on the program type signal PGM_NO having the logic value '0011' in the memory system capable of simultaneously performing maximum four programs. Since each of the RH analyzers 1220_1 to 1220_K shown in FIG. 11 is substantially the same as or similar to the RH analysis block 320 shown in FIG. 3, detailed descriptions thereof will be omitted herein.

The storage selection block 1240 may sequentially output row hammer information RH_INF1 to RH_INFK of each bank, which are simultaneously outputted from the RH analyzers 1220_1 to 1220_K, based on the program type signal PGM_NO.

The information storage block 1230 may store the row hammer information RH_INF1 to RH_INFK of each bank, which are sequentially outputted from the storage selection block 1240, based on the program type signal PGM_NO. The information storage block 1230 may include first to $M^{th}$ storage parts 1230_1 to 1230_M which correspond to the M types of programs. The information storage block 1230 may select a plurality of storage parts from the first to $M^{th}$ storage parts 1230_1 to 1230_M based on the program type signal PGM_NO and may store the row hammer information RH_INF of each bank in the selected storage parts.

When a specific program is requested from the host, a control logic 1100 may perform an address remap operation by using the row hammer information RH_INF of each bank stored in a storage part corresponding to the specific program among the first to $M^{th}$ storage parts 1230_1 to 1230_M included in the information storage block 1230 to provide a memory command M_CMD, a memory address M_ADDR and a memory data M_DATA to the memory device 200. Since the control logic 1100 shown in FIG. 11 is substantially the same as the control logic 110 shown in FIG. 3, detailed descriptions thereof will be omitted herein.

As described above, the memory system in accordance with another embodiment of the present invention may minimize the use of banks vulnerable to the row hammer phenomenon for each program by calculating a ranking of banks having a high row hammer risk for each of the programs which are simultaneously performed and scheduling the banks through the address remap operation. Consequently, the performance of the memory system may be optimized.

Although various exemplary embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including a plurality of banks; and
   a memory controller suitable for:
   controlling an operation of the memory device,
   setting a critical address for each bank during each refresh period of a single program having a command set requested from a host;
   calculating row hammer information for each bank by accumulatively counting a number of error corrections corresponding to the critical address for each bank during a subsequent program performed in response to the same command set as the single program, and
   scheduling the banks based on the row hammer information for each of the banks corresponding to a specific program when the specific program is requested from the host.

2. The memory system of claim 1, wherein the row hammer information includes:
   a refresh period for each bank for each program; and
   a row hammer occurrence ranking for each bank for each program.

3. The memory system of claim 1, wherein the memory controller schedules a first bank to be selected through an address remap operation and controls the refresh period of the first bank to be shorter than the other banks when the row hammer information corresponding to the specific program indicates that a row hammer phenomenon of the first bank occurs most frequently.

4. The memory system of claim 1, wherein the memory controller schedules a second bank to be selected more frequently than the other banks through an address remap operation and controls the refresh period of the second bank to be longer than the other banks when the row hammer information corresponding to the specific program indicates that a row hammer phenomenon of the second bank occurs least frequently.

5. The memory system of claim 1, wherein the memory controller includes:
   a row hammer information management section suitable for calculating the row hammer information for each bank by setting the critical address of the corresponding bank based on a command and an address inputted to each bank during each refresh period of a first program and by accumulatively counting the number of error corrections corresponding to the critical address of each bank during a second program performed in response to the same command set as the first program; and
   a control logic suitable for scheduling the banks by performing an address remap operation using the row hammer information corresponding to the specific program when the specific program is requested.

6. The memory system of claim 5, wherein the row hammer information management section includes:
   a command/address control block suitable for outputting a program type signal, an active command and a target address based on the command and the address transmitted from the host;
   a row hammer analysis block suitable for calculating the row hammer information for each bank by setting the critical address of each bank based on the active command and the target address during each refresh period of the first program and by accumulatively counting the number of error corrections corresponding to the critical address during the second program; and
   an information storage block suitable for storing the row hammer information for each bank based on the program type signal.

7. The memory system of claim 6, wherein the row hammer analysis block includes:
   an address set part suitable for counting the number of the active command inputted to each bank and setting the critical address of each bank based on the count number of the active command and the target address during each refresh period of the first program;

an error analysis part suitable for accumulatively counting the number of error corrections corresponding to the critical address of each bank based on error information during the second program; and a calculating part suitable for calculating the row hammer information for each bank based on the accumulatively counted number of error corrections.

8. The memory system of claim 7, wherein the address set part includes:
an address selection unit suitable for counting the number of the active command inputted to each bank for the target address based on a refresh command, and selecting an adjacent address of a corresponding target address as the critical address of each bank when the count number of the active command exceeds a threshold value; and
an address storage unit including a plurality of unit storages which correspond to the number of types of programs, and suitable for selecting any one of the unit storages based on the program type signal and storing or outputting the critical address of each bank in or from the selected unit storage.

9. The memory system of claim 7, wherein the error analysis part includes:
an accumulative counter suitable for accumulatively counting the number of error corrections corresponding to the critical address of each bank based on the error information during the second program; and
an error storage unit suitable for storing the accumulatively counted number of error corrections.

10. The memory system of claim 7, wherein the calculation part includes:
a period adjustment unit suitable for adjusting the refresh period of each bank based on the accumulatively counted number of error corrections; and
a ranking determination unit suitable for determining the row hammer occurrence ranking of each bank based on the accumulatively counted number of error corrections.

11. The memory system of claim 6, wherein the information storage block includes unit storages which correspond to a number obtained by multiplying the number of types of programs and the number of banks.

12. The memory system of claim 1, wherein the memory controller includes:
a command/address control block suitable for outputting a program type signal, an active command and a target address based on the command and the address transmitted from the host;
a plurality of row hammer analysis blocks corresponding to programs which are simultaneously performed among the programs;
a storage selection block suitable for outputting the row hammer information for each bank, which are simultaneously outputted from the plurality of row hammer analysis blocks, based on the program type signal;
an information storage block suitable for storing the row hammer information for each bank, which are simultaneously outputted from the storage selection block, based on the program type signal; and
a control logic suitable for scheduling the banks by performing an address remap operation using the row hammer information corresponding to a specific program when the specific program is requested from the host,
wherein each of the plurality of row hammer analysis blocks calculates the row hammer information for each bank by setting the critical address of the corresponding bank based on the active command and the target address during each refresh period of a single program and by accumulatively counting the number of error corrections corresponding to the critical address of each bank during a subsequent program performed in response to the same command set as the single program.

13. An operation method for a memory system having a memory device including a plurality of banks and a controller, the operation method comprising:
setting, by the controller, a critical address for each bank during each refresh period of a single program having a command set requested from a host;
calculating, by the controller, row hammer information for each bank by accumulatively counting a number of error corrections corresponding to the critical address for each bank during a subsequent program performed in response to the same command set as the single program;
storing, by the controller, the row hammer information in information storage blocks of the controller; and
scheduling, by the controller, the banks based on the row hammer information for each bank corresponding to a specific program among the row hammer information stored in the information storage blocks when the specific program is requested from the host.

14. The operation method of claim 13, wherein the row hammer information includes:
a refresh period for each bank for each program; and
a row hammer occurrence ranking for each bank for each program.

15. The operation method of claim 13, wherein the scheduling of the banks includes:
scheduling a first bank to be selected at a minimum through an address remap operation and controlling the refresh period of the first bank to be shorter than the other banks when the row hammer information corresponding to the specific program indicates that a row hammer phenomenon of the first bank occurs most frequently.

16. The operation method of claim 13, wherein the scheduling of the banks includes:
scheduling a second bank to be selected more frequently than the other banks through an address remap operation and controlling the refresh period of the second bank to be longer than the other banks when the row hammer information corresponding to the specific program indicates that a row hammer phenomenon of the second bank occurs least frequently.

17. The operation method of claim 13, wherein the calculating of the row hammer information for each bank and storing of the row hammer information in the information storage blocks includes:
outputting a program type signal, an active command and a target address based on a command and an address transmitted from the host;
counting the number of the active command inputted to each bank and setting the critical address of each bank based on the count number and the target address during each refresh period of a first program;
accumulatively counting the number of error corrections corresponding to the critical address of each bank based on an error information during a second program performed in response to the same command set as the first program;

calculating the row hammer information for each bank based on the accumulatively counted number of the error corrections; and storing the row hammer information for each bank in the information storage blocks based on the program type signal.

18. The operation method of claim 13, wherein the information storage blocks include unit storages which correspond to a number obtained by multiplying the number of types of programs and the number of banks.

19. A memory system comprising:

a memory device including a plurality of banks; and a controller suitable for:

controlling the memory device to perform a program;

detecting a critical address of each bank while performing the program;

adjusting a refresh period of each bank, and determining a row hammer occurrence ranking of each bank based on an accumulative number of error corrections corresponding to the critical address while subsequently performing the program;

scheduling each bank based on the adjusted refresh period and the row hammer occurrence ranking while further subsequently performing the program.

* * * * *